US006573130B1

(12) United States Patent
Patelmo et al.

(10) Patent No.: US 6,573,130 B1
(45) Date of Patent: Jun. 3, 2003

(54) PROCESS FOR MANUFACTURING ELECTRONIC DEVICES HAVING NON-SALICIDATED NON-VOLATILE MEMORY CELLS, NON-SALICIDATED HV TRANSISTORS, AND SALICIDATED-JUNCTION LV TRANSISTORS

(75) Inventors: Matteo Patelmo, Trezzo Sull'adda (IT); Giovanna Dalla Libera, Monza (IT); Nadia Galbiati, Seregno (IT); Bruno Vajana, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/426,094

(22) Filed: Oct. 22, 1999

(30) Foreign Application Priority Data

Oct. 23, 1998 (EP) .............................. 98830644

(51) Int. Cl.$^7$ ........................................ H01L 21/8238
(52) U.S. Cl. ...................... 438/201; 438/258; 438/593
(58) Field of Search ............................ 438/201, 258, 438/FOR 187, FOR 203, FOR 212, FOR 420, 593

(56) References Cited

U.S. PATENT DOCUMENTS

| | | | | |
|---|---|---|---|---|
| 4,390,971 A | * | 6/1983 | Kuo ............................. | 365/104 |
| 4,811,078 A | * | 3/1989 | Tigelaar et al. .............. | 257/306 |
| 5,472,887 A | | 12/1995 | Hutter et al. .................. | 437/34 |
| 5,933,730 A | * | 8/1999 | Sun et al. ..................... | 438/241 |
| 6,022,778 A | * | 2/2000 | Contiero et al. ............. | 438/257 |
| 6,074,916 A | * | 6/2000 | Cappelletti ................... | 438/258 |
| 6,087,211 A | * | 7/2000 | Kalnitsky et al. ............ | 438/201 |
| 6,121,079 A | * | 9/2000 | Kim ............................. | 257/390 |
| 6,159,795 A | * | 12/2000 | Higashitani et al. ......... | 438/257 |

FOREIGN PATENT DOCUMENTS

| | | |
|---|---|---|
| EP | 0 216 053 A2 | 4/1987 |
| EP | 0 811 983 A1 | 12/1997 |
| JP | 09283643 | 10/1997 |

OTHER PUBLICATIONS

Shiba and Kubota, "Downscaling of Floating–Gate EEPROM Modules for ASIC Applications," *Electroncis and Communications in Japan*, Part 2 75(12), pp. 67–76, 1992.
Wolf, Stanley and Richard N. Tauber, *Silicon Processing for the VLSI Era*, vol. 3, Lattice Press, Sunset Beach, California, 1986, pp. 608–611.

* cited by examiner

*Primary Examiner*—George Fourson
*Assistant Examiner*—Michelle Estrada
(74) *Attorney, Agent, or Firm*—Lisa K. Jorgenson; E. Russell Tarleton; SEED IP Law Group PLLC

(57) ABSTRACT

A process that provides for the manufacture of LV transistors with salicidated junctions on first areas of a substrate, HV transistors on second areas, and memory cells on third areas. The process includes forming LV oxide regions and LV gate regions on the first areas, HV oxide regions on the second areas, selection oxide regions, tunnel oxide regions, and matrix oxide regions on the third areas; forming floating gate regions and insulating regions on the tunnel oxide regions and the matrix oxide regions; forming first LV source and drain regions laterally to the LV gate regions; forming silicide regions on the first source and drain regions and on the LV gate regions; forming semiconductor material regions completely covering the second and third areas; and at the same time forming HV gate regions on the HV oxide regions, forming selection gate regions on the selection oxide regions, and forming control gate regions on the insulating regions through shaping of the semiconductor material regions.

11 Claims, 11 Drawing Sheets

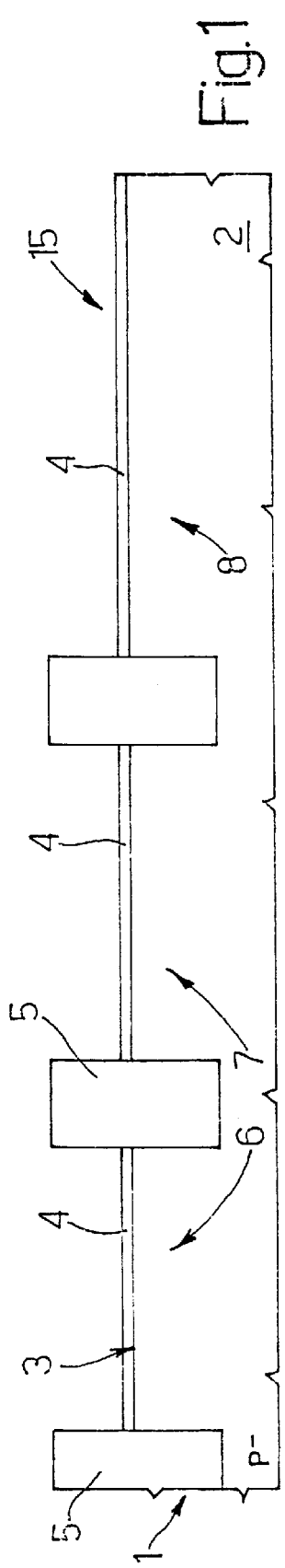
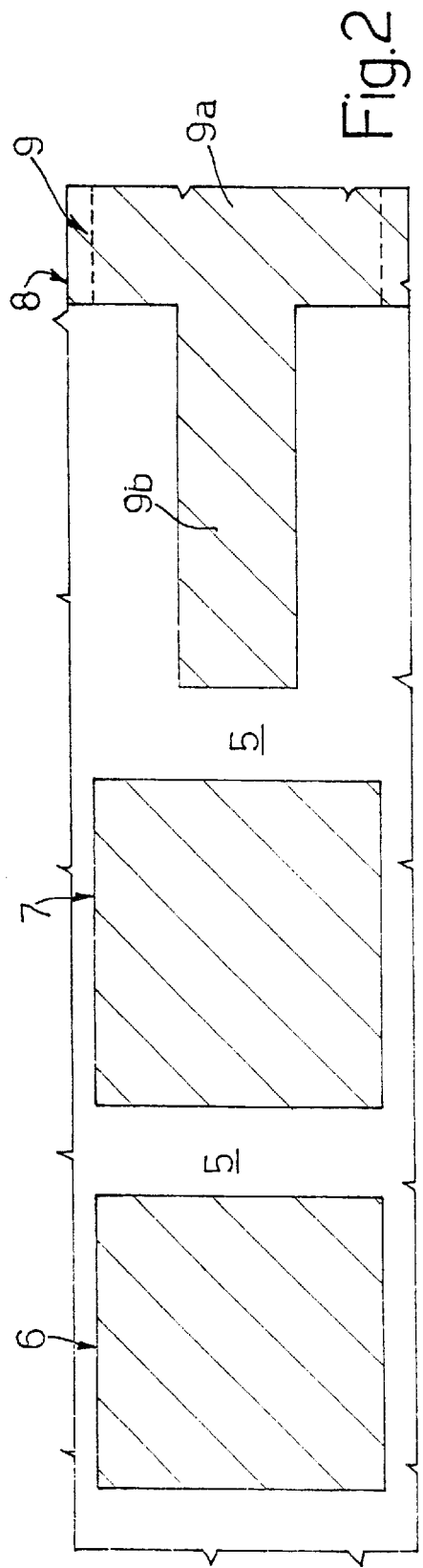
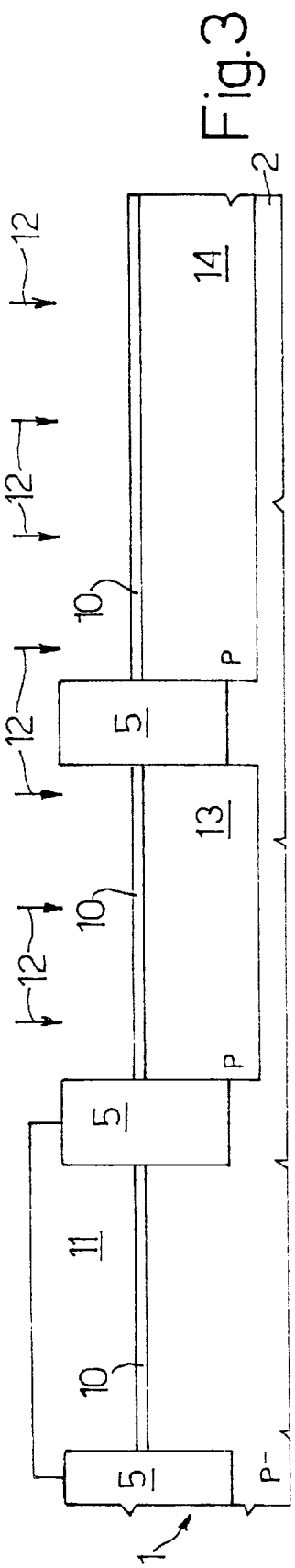

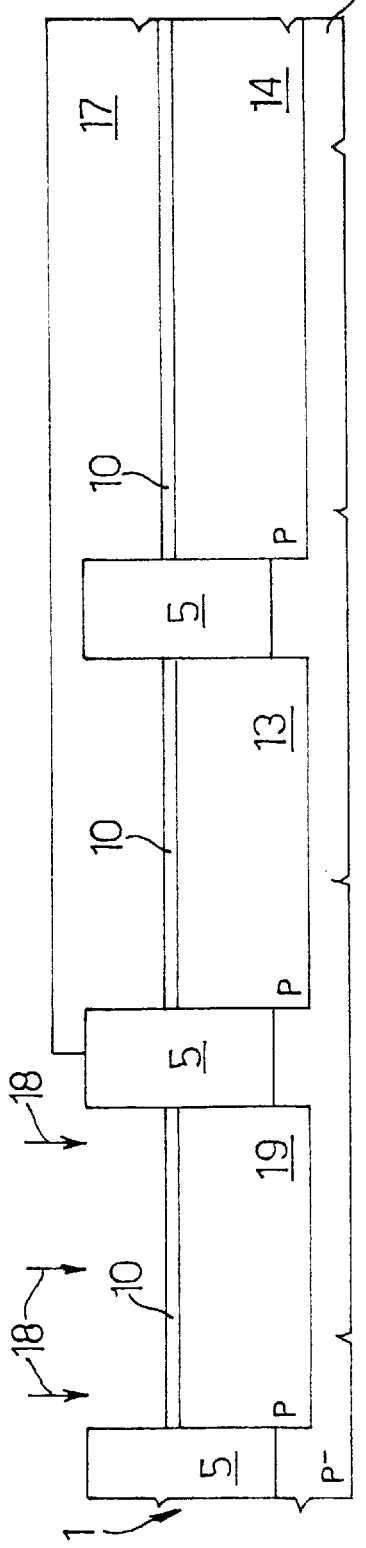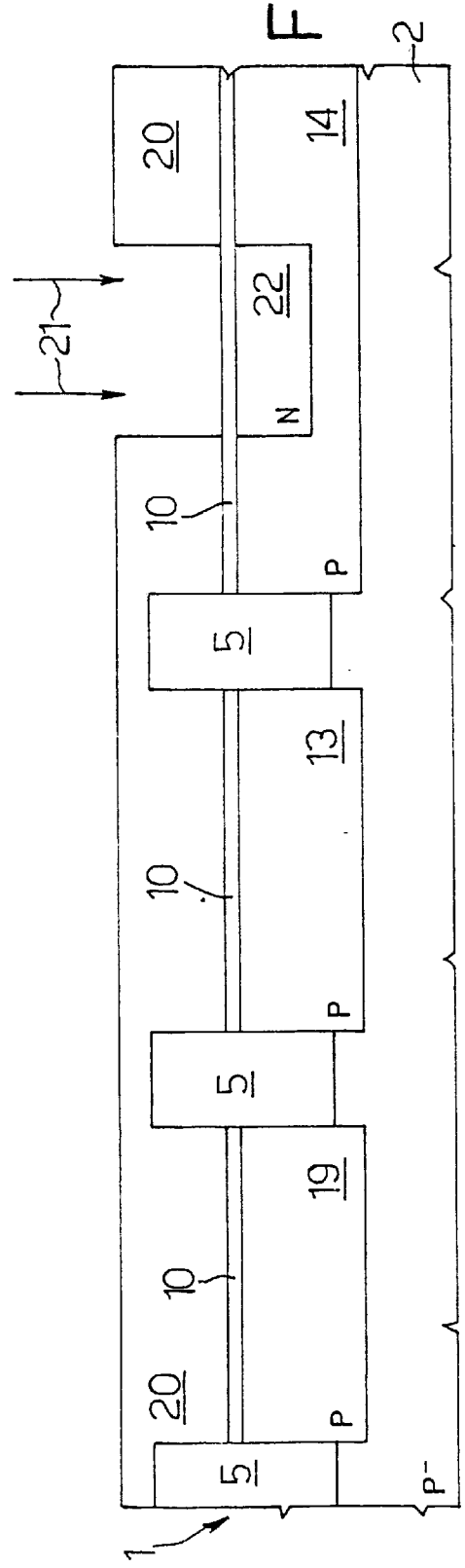

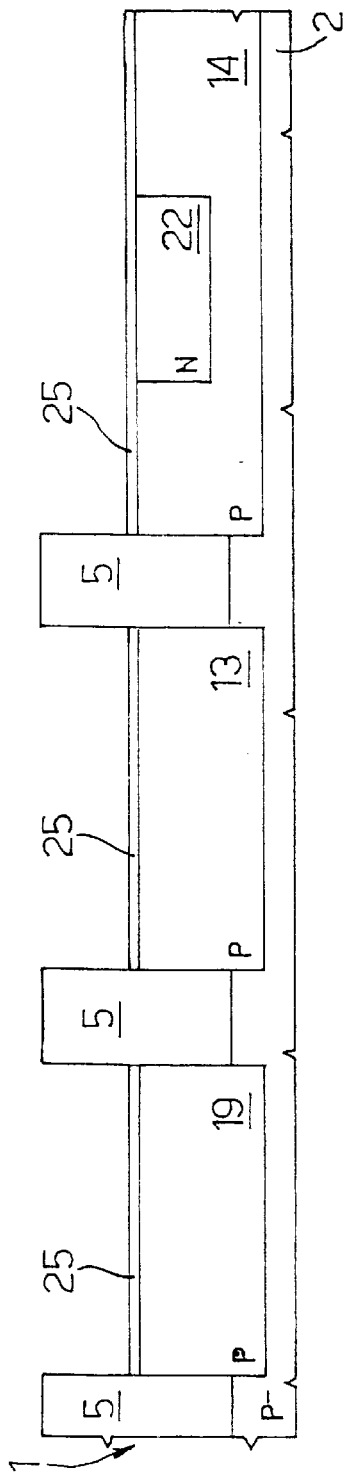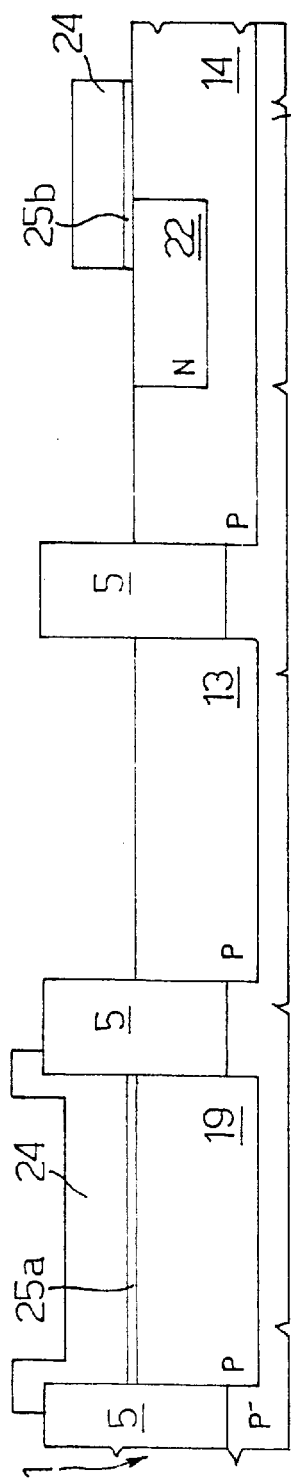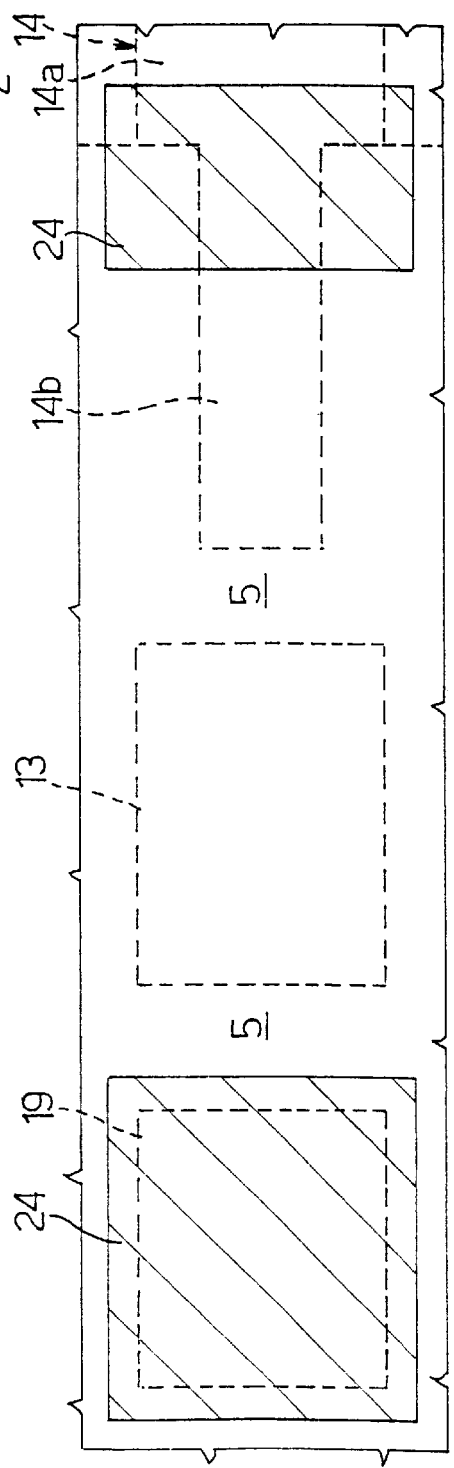

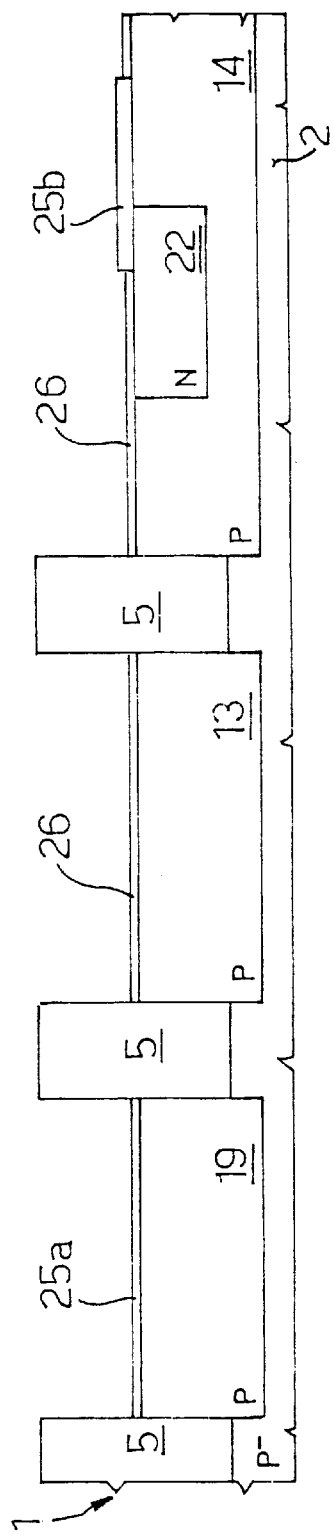
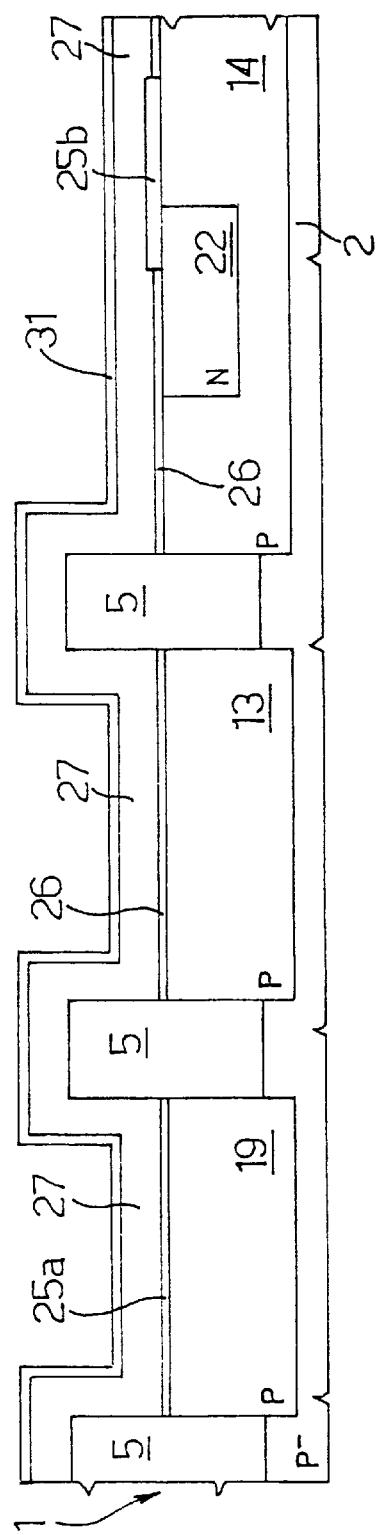

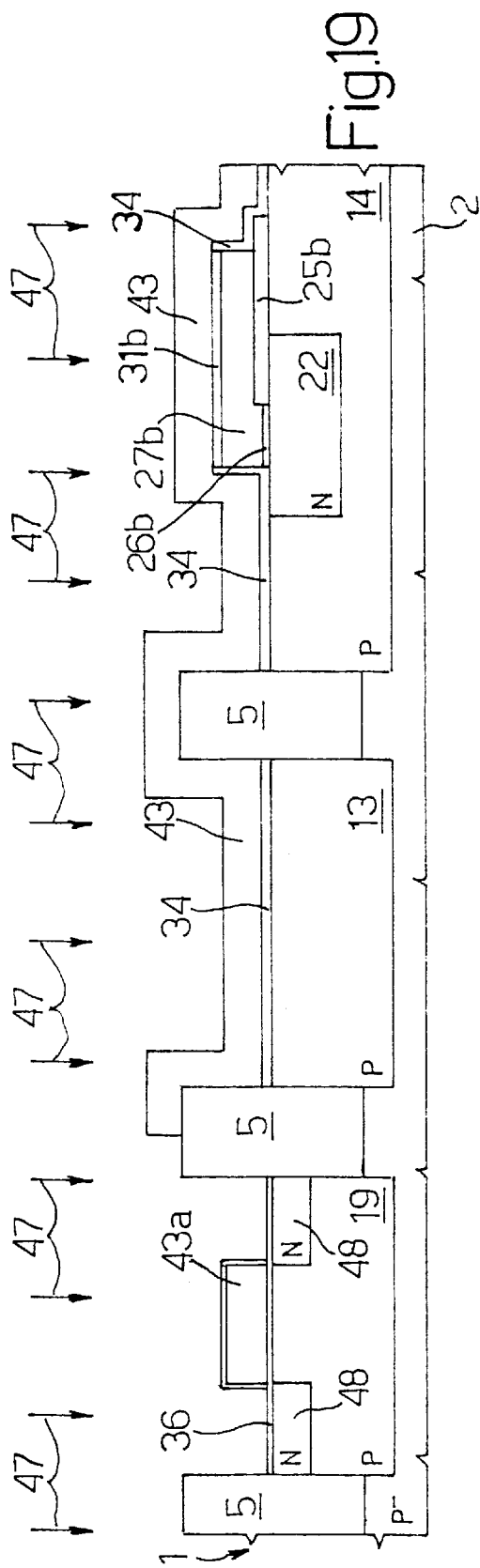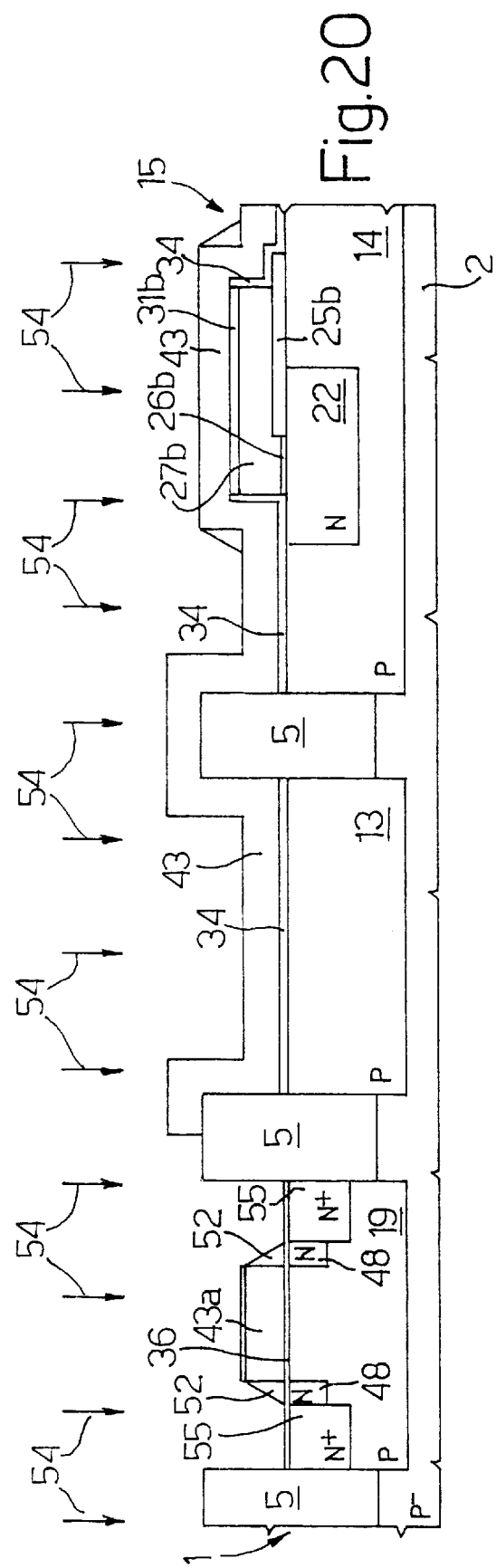

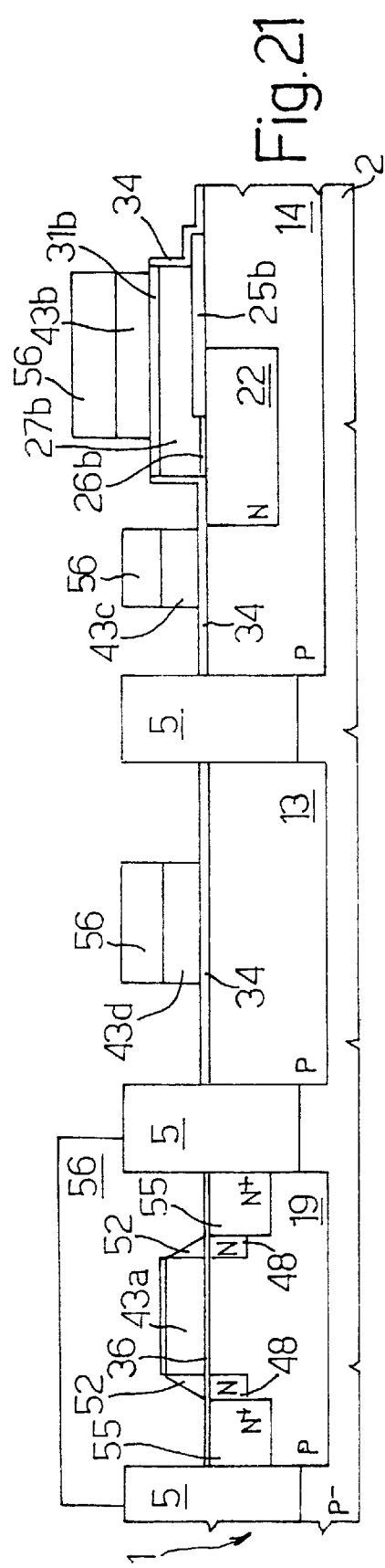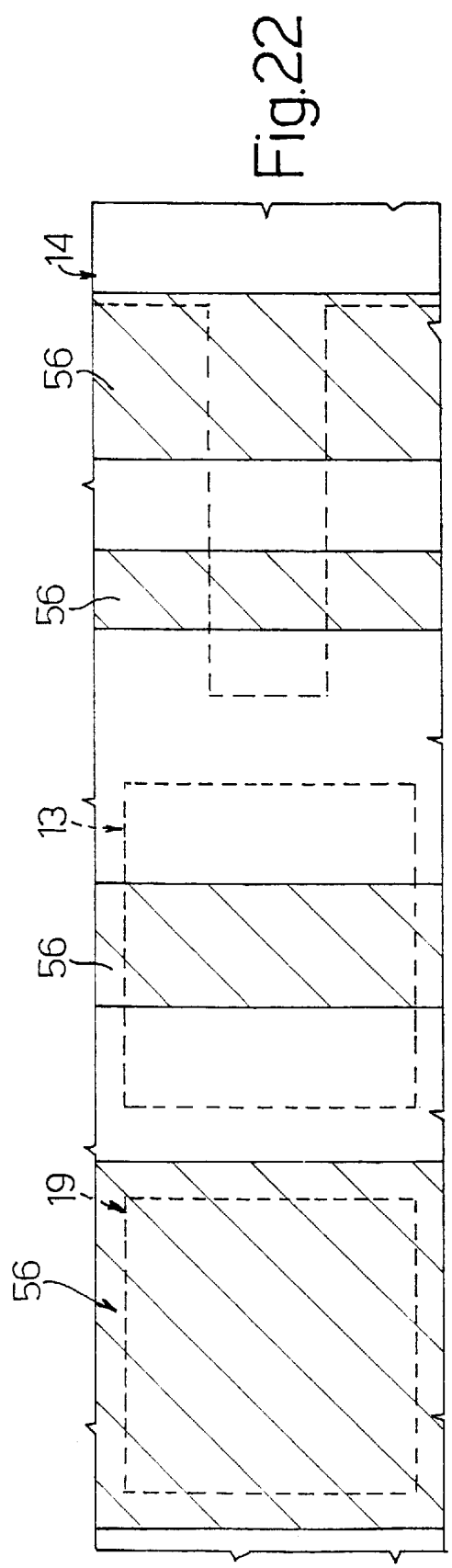

PROCESS FOR MANUFACTURING ELECTRONIC DEVICES HAVING NON-SALICIDATED NON-VOLATILE MEMORY CELLS, NON-SALICIDATED HV TRANSISTORS, AND SALICIDATED-JUNCTION LV TRANSISTORS

TECHNICAL FIELD

The present invention relates to a process for manufacturing electronic devices having non-salicidated non-volatile memory cells, non-salicidated HV transistors and salicidated-junction LV transistors.

BACKGROUND OF THE INVENTION

In advanced processes (gate lengths not exceeding 0.35 µm) the need has arisen to integrate EEPROM-type non-volatile memories in high-speed devices that use the technique of saliciding the diffusions. This technique is based on the use of a layer of "salicide" (self-aligned silicide) that reduces the resistivity of the junctions. The salicide layer (typically of titanium but also of cobalt or another transition metal) is formed by depositing a titanium layer on the entire device surface and carrying out a heat treatment phase that causes titanium to react with silicon, left bare on the junctions and the gate regions, so as to form titanium silicide. The unreacted titanium (that deposited on oxide regions for example) is then etched away using a suitable solution leaving titanium silicide intact. In this way both the gate regions and the junctions have in parallel a silicide layer of low resistivity (approx. 3–4Ω/square) which enables the transistor series resistance to be reduced. The "salicide" technique is described, for example, in the article "Application of the self-aligned titanium silicide process to very large-scale integrated n-metal-oxide-semiconductor and complementary metal-oxidesemi-conductor technologies" by R. A. Haken in J. Vac. Sci. Technol. B, vol. 3, No. 6, November/December 1985.

The high voltages required for programming non-volatile memories (greater than 16 V) are, however, incompatible with saliciding the diffusions of the memory cells, since the breakdown voltage of salicidated junctions is less than 13 V.

Process flows permitting integration of non-volatile memory cells and high-speed transistors with salicidation have been investigated; however, this integration is difficult because these components have different characteristics and require different process steps.

SUMMARY OF THE INVENTION

The invention provides a process for manufacturing non-volatile cells and high-speed transistors with a small number of masks that is easy to implement and offers possible lower costs.

BRIEF DESCRIPTION OF THE DRAWINGS

For understanding the present invention an embodiment will now be described, purely by way of non-exhaustive example, with reference to the accompanying drawings wherein:

FIG. 1 shows a cross-section of a silicon wafer in an initial step of the manufacture process according to the invention;

FIG. 2 shows a top view of the wafer of FIG. 1;

FIGS. 3–7 show cross-sections similar to that of FIG. 1, in successive manufacture steps;

FIG. 8 shows a top view of the wafer of FIG. 7;

FIGS. 9–11 show cross-sections similar to that of FIG. 7, in successive manufacture steps;

FIGS. 19–21 show cross-sections similar to that of FIG. 17, in successive manufacture steps;

FIG. 22 shows a top view of the wafer of FIG. 21; and

DETAILED DESCRIPTION OF THE INVENTION

Figure 11:
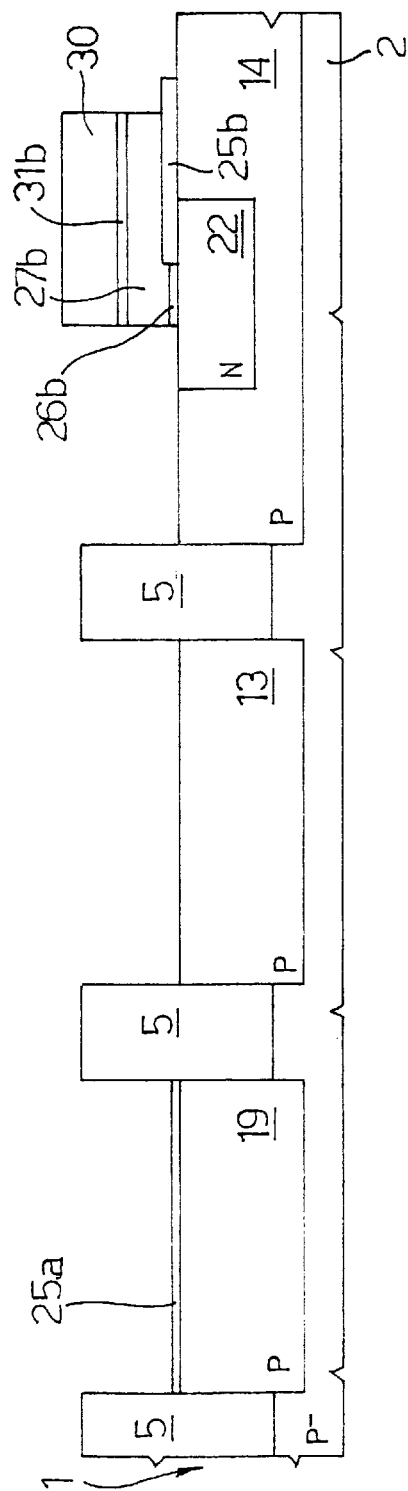

The description below relates, by way of example, to the fabrication of LV (low voltage and high-speed) and HV (high voltage) NMOS transistors, LV and HV PMOS transistors and EEPROM memory cells formed by a selection transistor and a memory transistor. In particular, given the duality in the manufacture of NMOS and PMOS transistors, the drawings only show the steps relating to the NMOS transistors and the steps relating to the PMOS transistors are only described. The EEPROM memory cells form a memory array and are produced in a part of the wafer, also referred to as array zone 15.

In FIG. 1, a wafer 1 formed by a substrate 2 of single-crystal silicon, here P-type, has been subjected to active area definition steps. In detail, with the surface 3 of the substrate 2 covered by an active area mask 4 of non-oxidizable material (typically formed by a double layer of silicon oxide and silicon nitride, defined through resist), the wafer 1 has been subjected to thermal oxidation. Consequently, areas of thick oxide (field oxide 5) have grown on the parts of substrate 2 not covered by the active area mask 4 and delimit from each other active areas of the substrate intended to house various components of the device to be formed. In particular, three active areas are shown in FIG. 1, an LV active area 6, intended to house an LV NMOS transistor, an HV active area 7, intended to house an HV NMOS transistor, and an array active area 8 intended to house EEPROM memory cells.

In detail and in a per se known manner, the array active area 8 defines a grid, whereof FIG. 2 shows in complete manner only the part relating to a cell 9, having a substantially T-shape rotated through 90° and comprising a leg 9a and a crosspiece 9b. The leg 9a is contiguous and electrically connected to corresponding legs 9a of other cells located above and below the shown cell, and shown only in part. Leg 9a is also joined to a leg of an adjacent cell on the right (not shown) whose structure is symmetrical to cell 9. The legs 9a are intended to house source regions of the memory transistors. The end of the crosspieces 9b not connected to the legs 9a is intended to house drain regions of the selection transistors, and the gate regions of the cells are to be produced on the crosspieces 9b. Further active areas not shown in the drawings are generally provided to produce LV or HV PMOS transistors.

The active area mask 4 is then removed, the free surface 3 of the substrate is oxidized to form a sacrificial oxide layer 10 and a masked implant of N-type ionic dopants is carried out to form N-HV regions (not shown) for the HV PMOS transistors. Then, using an HV P-well mask 11 of resist that covers the entire surface of the wafer 1 apart from the HV active areas 7 and the array active areas 8, P-type ionic dopants are implanted as shown diagrammatically in FIG. 3 by arrows 12. P-type P-HV regions 13 for the high voltage transistors and a P-matrix region 14, also P-type, for the cells, thus form in substrate 2, as shown in FIG. 3. The P-HV regions 13 and P-matrix regions 14 exactly reproduce the form of the respective HV active areas 7 and array active areas 8 and so each cell comprises legs 14a (corresponding to legs 9a of the active areas of cell 9, see FIG. 8) and crosspieces 14b (FIG. 8, corresponding to crosspieces 9b).

After removing the HV P-well mask 11, a masked implant of N-type ionic dopants is carried out to form N-LV regions (not shown) for the LV PMOS transistors. Then, using an LV P-well mask 17 of resist covering the entire surface of the wafer 1 apart from the LV active areas 6, P-type ionic dopants are implanted, as shown diagrammatically in FIG. 4 by arrows 18. P-type P-LV regions 19 for the LV NMOS transistors thus form in the substrate 2 as shown in FIG. 4. In this way P-HV regions 13 and P-LV regions 19 are separated from each other, and their electrical properties may be optimized with respect to the desired electrical properties.

After removing the LV P-well mask 17, a capacitor mask 20 is formed hat covers the entire surface of the wafer 1 except strips perpendicular to the crosspieces 14b. N-type ionic dopants (such as phosphorus) are then implanted, as shown diagrammatically in FIG. 5 by arrows 21. Continuity regions 22, of N-type, required for electrical continuity between each selection transistor and the associated memory transistor of each cell, are thus formed in the crosspieces 14b. The structure of FIG. 5 is thus obtained.

After removing the capacitor mask 20, wafer 1 is annealed, the sacrificial layer 10 is removed, and a matrix oxidation is carried out for forming a matrix oxide layer 25 on the surface of all regions 13, 14 and 19. Then, using a matrix oxide mask 24 shown in cross-section in FIG. 7 and in a top view in FIG. 8, the matrix oxide layer is removed everywhere apart from underneath matrix oxide mask 24, forming a region 25b in the P-matrix region 14, partially on the continuity region 22 and partially covering the leg 9a, and a masking region 25a on the P-LV region 19 (FIG. 7).

After removing the matrix oxide region 24, wafer 1 is oxidized again, forming a tunnel oxide layer 26 on the entire exposed substrate surface and increasing the thickness of the already present oxide (regions 25a, 25b) in regions 14 and 19. The structure of FIG. 9 is thus obtained.

A first multi-crystal silicon layer (poly1 layer 27), suitably doped, is then deposited; an interpoly dielectric layer 31, formed by a triple layer of ONO (Oxide of silicon/Nitride of silicon/Oxide of silicon) for example, is then formed, as shown in FIG. 10.

Figure 12:
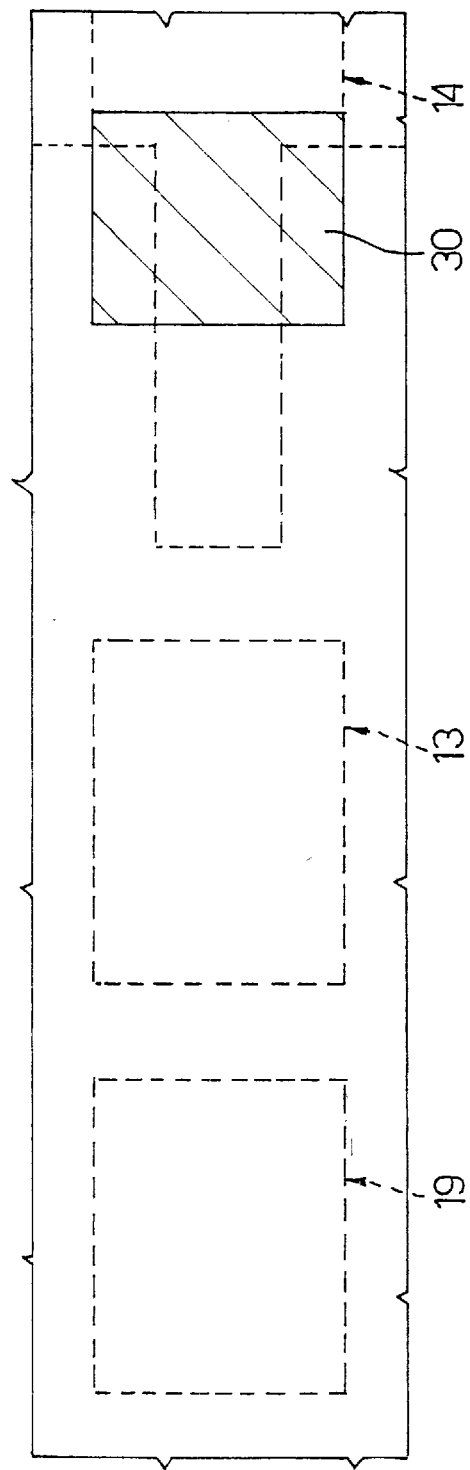
FIG. 12 shows a top view of the wafer of FIG. 11.

A floating gate mask 30 shown in FIGS. 11 and 12 is then formed. Dielectric layer 31, poly1 layer 27, and tunnel oxide layer 26 are then etched everywhere except where floating gate regions of the memory transistors, denoted by 27b in FIG. 11, are to be produced. Consequently, of the tunnel oxide layer 26 only a tunnel region 26b remains, contiguous to an edge of the floating gate region 27b of the memory transistor. In this step the thickness of the region 25a on the active area 19 decreases again.

Figure 13:
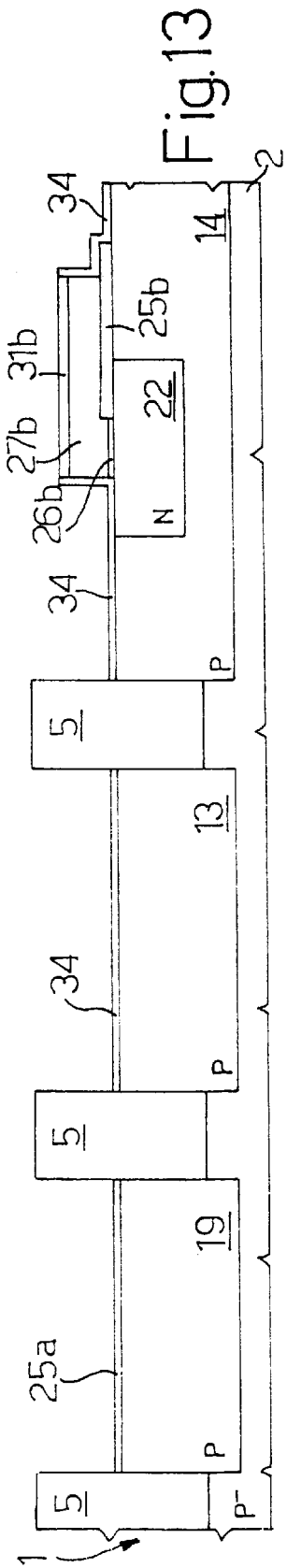
FIGS. 13–17 show cross-sections similar to that of FIG. 11, in successive manufacture steps.
Figure 14:
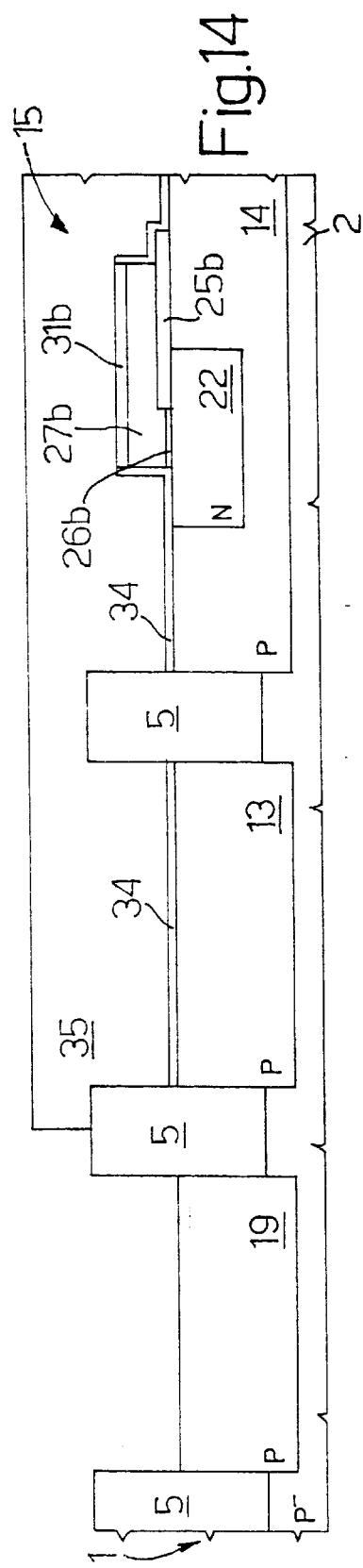

After removing the floating gate mask 30 an HV oxidation step is carried out for forming an HV gate oxide layer 34 on the entire free surface of substrate 2, particularly on P-HV 13 and P-matrix 14 regions (FIG. 13). Oxide portions 34 also form laterally to the floating gate region 27b of the memory transistor, as shown in FIG. 13, and region 25a increases in thickness again. Region 25a is then removed from the P-LV regions 19 (FIG. 14) using an HV oxide mask 35, of resist, which covers the P-HV regions 13 and the array zone 15.

Figure 15:
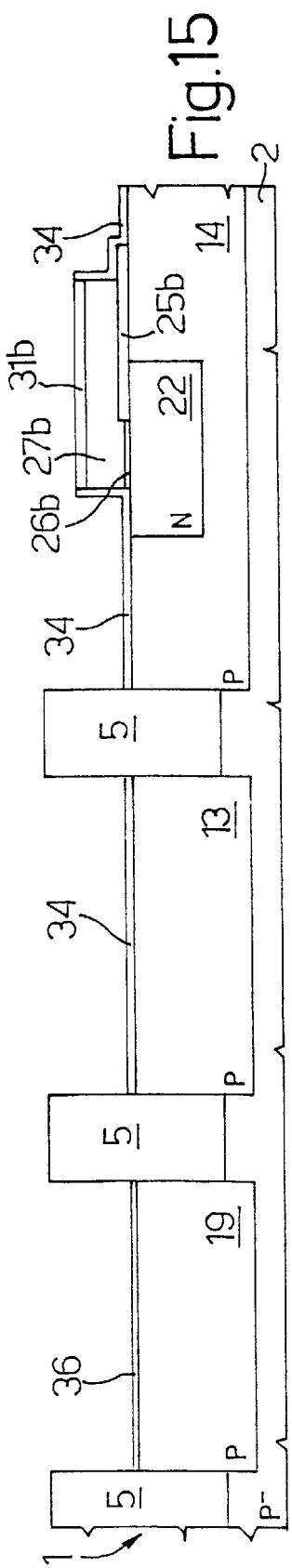

After removing the HV oxide mask 35, an LV oxidation step is carried out for forming an LV gate oxide layer 36 on the P-LV regions 19. Furthermore, the HV gate oxide layer 34 increases in thickness on P-HV 13 and P-matrix 14 regions, obtaining the structure of FIG. 15.

Figure 16:
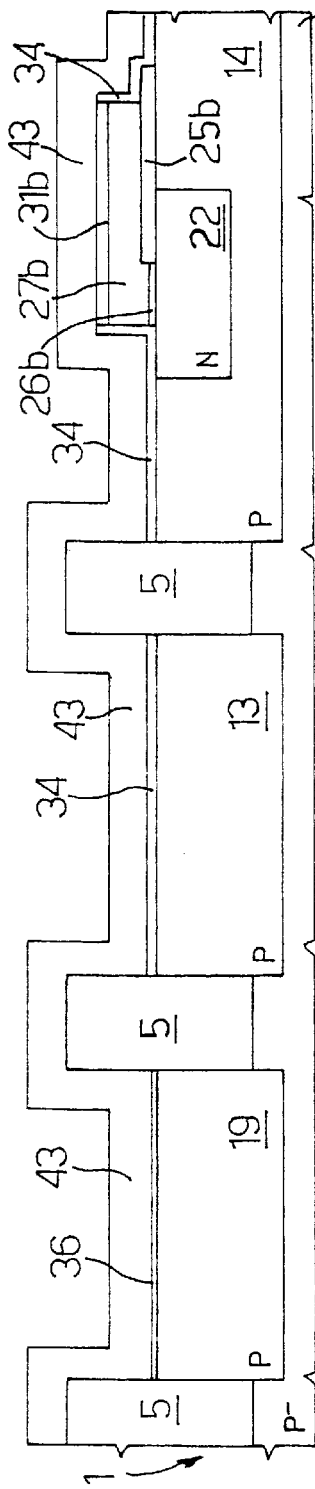
Figure 17:
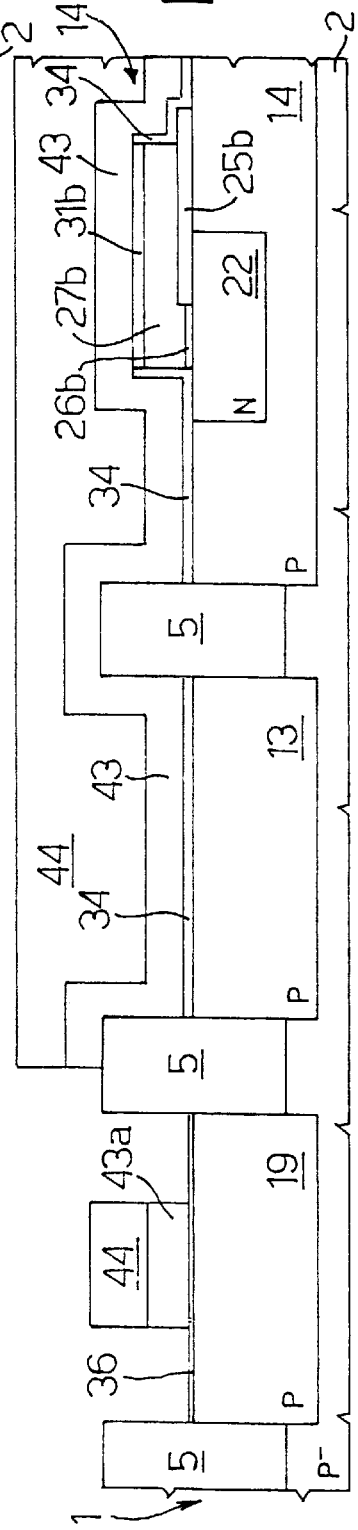
Figure 18:
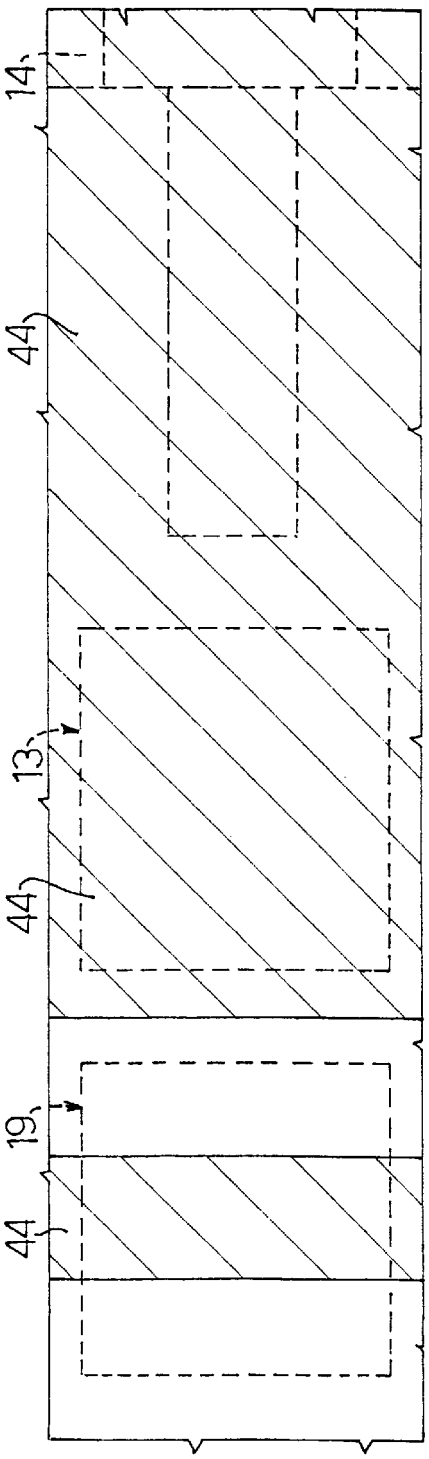
FIG. 18 shows a top view of the wafer of FIG. 17.

A second multi-crystal silicon layer (poly2 layer 43, not doped) is then deposited, FIG. 16. An LV gate mask 44 is formed and covers the N-HV regions (not shown), the P-HV regions 13 and the array zone 15. The LV gate mask 44 also covers the poly2 layer on the P-LV regions 19 where the gate regions of the LV transistors, whether NMOS or PMOS, are to be defined, as shown in FIGS. 17 and 18, and on the N-LV regions (not shown) where the gate regions of the LV PMOS transistors are to be defined. The exposed portions of poly2 layer 43 are then removed, obtaining the structure of FIG. 17 wherein the remaining portions of poly2 on the P-LV regions 19 form gate regions 43a of the LV NMOS transistors. As can be seen, while defining the gate regions of the LV transistors, the layers on P-HV 13 and P-matrix 14 regions are protected, as are the layers on the N-HV regions (not shown). Consequently the described process defines separately the gate regions of the LV transistors and HV transistors and the memory cells.

After a reoxidation step, to seal the gate regions 43a of LV NMOS transistors, using a resist mask not shown and covering the N-LV and N-HV regions, N-type ionic dopants are implanted (LDDN implant), as shown diagrammatically in FIG. 19 by arrows 47. N-type LDD regions 48 thus form at the sides of the gate regions 43a (inside P-LV regions 19). The poly2 layer 43 is also suitably doped.

After removing the not-shown resist mask, P-type ionic dopants are implanted through a mask. In particular, during this step, P-HV 13 and P-LV 19 regions and array zone 15 are covered while P-type LDD regions (not shown) form in the N-LV regions. On the entire surface of the wafer 1 a dielectric layer (TEOS—TetraEthylOrthoSilicate for example) is then deposited. Then, in per se known manner, the TEOS layer is anisotropically etched and is removed completely from horizontal portions and remains on the sides of gate regions 43a where it forms spacers 52 and, in part, on the floating gate regions 27b, on the array zone 15 (FIG. 20). Spacers are not, however, formed on the field oxide regions 5, because of the bird's beak shape of their edges (in per se known manner and not shown for reasons of simplicity). Spacers do not form on the P-HV regions 13 and corresponding N-HV regions, since the gate regions of HV transistors have not yet been defined.

Subsequently, using a resist mask not shown and covering N-LV and N-HV regions, N-type ionic dopants are implanted, as shown schematically in FIG. 20 by arrows 54. LV-NMOS source and drain regions 55, of N+ type, thus form in the P-LV regions 19, self-aligned with spacers 52. LV-NMOS source and drain regions 55 are more doped than LDD regions 48. Furthermore, poly2 layer 43 and gate regions 43a are doped with N dopants, while the zones where HV and LV PMOS transistors are to be produced are covered. The structure of FIG. 20 is thus obtained.

After removing the resist mask (not shown), a similar step of implanting P-type ionic dopants through a mask to form the respective source and drain regions in the N-LV type regions (in a manner not shown) and for P-type doping the poly2 layer 43 on the N-LV and N-HV regions. In this step, the P-LV 19, P-HV 13 and P-matrix 14 regions are completely covered.

An HV gate mask 56 is then formed, covering the surface of wafer 1 except the active areas where the gate regions of high voltage transistors (P-HV regions 13 in the case of HV NMOS) and the portions of the P-matrix region 14 intended to form the gate regions of the selection transistor and the control gate regions of the memory transistors are to be formed (see FIGS. 21 and 22). The portions of the poly2 layer 43 not covered by the HV gate mask 56 are then etched. The structure of FIG. 21 is thus obtained.

Figure 23:
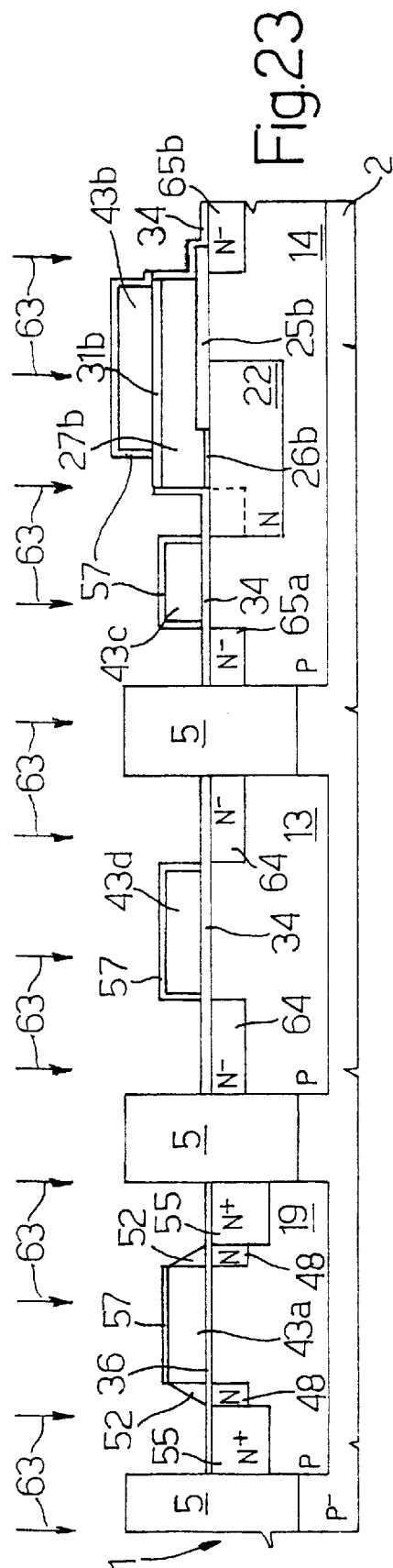
FIGS. 23–25 show cross-sections similar to that of FIG. 21, in successive manufacture steps.

A re-oxidation step is then carried out, forming an oxide layer 57 on all the free surface of substrate 2, particularly laterally to the floating gate regions 27b and 43b of the memory transistors and laterally to the gate regions of the selection transistors, as shown in FIG. 23. The gate region of the selection transistor is denoted by 43c, the gate region of the memory transistor is denoted by 43b and the gate region of HV NMOS transistor is denoted by 43d.

After removing the HV gate mask 56 and reoxidation, an NHV mask, not shown and covering the N-LV and N-HV regions (not shown), is formed. Using the NHV mask N-type ionic dopants are implanted, as shown diagrammatically in FIG. 23 by arrows 63. In the P-HV regions 13, on the two sides of the HV gate regions 43d, HV-NMOS source and drain regions 64, of N type, less doped than LV-NMOS source and drain regions 55 are thus formed. At the same time, in P-matrix region 14, drain regions 65a of the selection transistor are formed, on one side and in a manner self-aligned with the gate regions 43c of the selection transistors, and source regions 65b of the memory transistor, on the side not facing the respective selection transistor, aligned with the gate region 43b of the memory transistors. Furthermore, the zones between each selection transistor and the associated memory transistor are also implanted. This implant generally takes place, however, inside the continuity regions 22, more doped, and so it is not visible (for this reason the associated zone has been shown in dashed lines). In case of misalignments, however, this implant ensures electrical continuity. HV-NMOS source and drain regions 64 of HV selection transistor 65a and source regions 65b of the memory transistor (like the source regions) have a lower doping level than LV-NMOS source and drain regions 55 and so they have a greater breakdown voltage but a greater resistivity.

After removing the NHV mask, source and drain regions of the HV PMOS transistors are similarly implanted through a mask (not shown).

Figure 24:
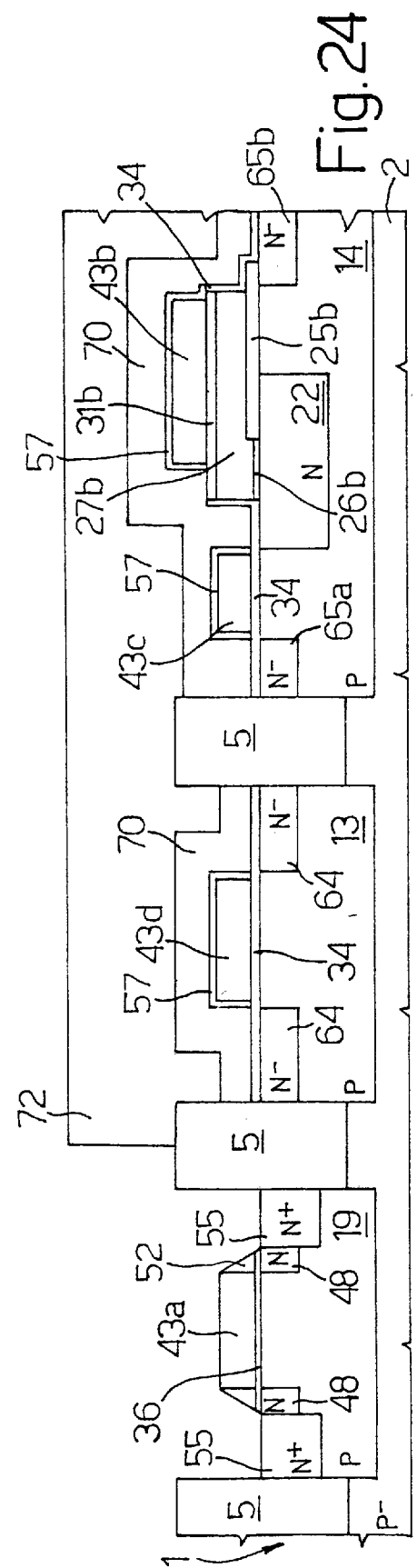

A protective dielectric layer 70, of TEOS or nitride for example, is then deposited on the surface of wafer 1. A salicide protection mask 72, shown in FIG. 24, is then formed, covering the surface of wafer 1 except the active areas where low-voltage transistors are present (P-LV regions 19 in case of NMOS). Using the salicide protection mask 72 the dielectric layer 70 is removed on P-LV regions 19 (FIG. 24). After removing the salicide protection mask 72, if zener diodes, lightly doped precision resistors and/or N and P type transistors with non-salicidated junctions are to be formed, a dielectric layer is deposited and defined through a suitable mask, not shown. Otherwise the uncovered poly2 layer is salicidized immediately. Salicidation, carried out as above described, forms titanium silicide regions on source and drain regions of LV PMOS and NMOS transistors (silicide regions 75a1 on LV-NMOS source and drain regions 55 and similar ones for LV PMOS transistors), and on the gate regions of LV PMOS and NMOS transistors (silicide regions 75a2 on the gate regions 43a for LV NMOS transistors and similar ones for LV PMOS transistors), as shown in FIG. 25.

Figure 25:
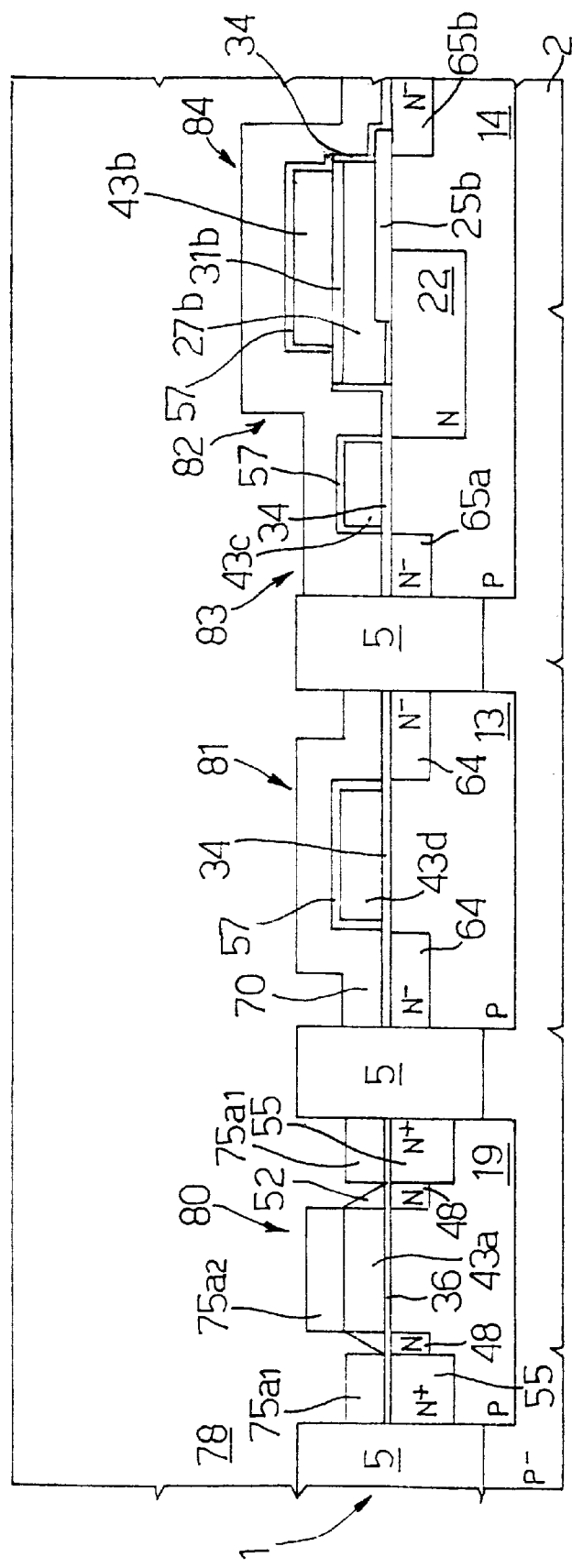

After forming a protection dielectric layer 78, the final structure of FIG. 25 is obtained, comprising an LV NMOS transistor 80, an HV NMOS transistor 81 and an EEPROM cell 82 formed by a selection transistor 83 and a memory transistor 84. The final steps follow, including forming contacts and electrical interconnection lines, depositing a passivation layer, etc.

In the final device, therefore, the EEPROM cells 72 are not salicidated and have high breakdown voltage. Furthermore, the memory transistor 84 is completely non-self-aligned. The selection transistor 83 is, however, self-aligned on both sides. This enables a shorter structure to be obtained taking account of possible misalignments of a single shaping step.

LV (NMOS and PMOS) transistors have a high-speed LDD structure with dual gate (gate region 43a doped with ionic dopants of the same type as source and drain regions 48, 55) and salicidated source, drain regions 55 and gate region 43a.

HV (NMOS and PMOS) transistors have a dual gate and drain extension structure and are not salicidated.

The described method thus enables manufacture of LV, HV and memory components having very different properties, at the same time, optimizing the number of necessary steps.

Shaping of matrix oxide mask 24 shown in FIG. 8 and consequent forming masking region 25b on P-LV region 19 protects the P-LV region 19 during the subsequent process steps. In fact, according to the above, P-LV region 19 undergoes a single etching step (to remove the HV gate oxide layer 34) and is, in contrast, protected during the preceding etching of matrix oxide 25 (FIG. 7) and tunnel oxide 26 (FIG. 11). Consequently the surface of the P-LV region 19 is not damaged during these two preceding etching steps.

Finally, numerous modifications and variants may be introduced to the method and device described and illustrated herein, all of which come within the scope of the invention as defined in the accompanying claims.

What is claimed is:

1. A process for manufacturing electronic devices having LV transistors, HV transistors and memory cells, comprising:

defining LV oxide regions on first areas of a substrate of silicon where low voltage transistors are to be formed, HV oxide regions on second areas of said substrate where high voltage transistors are to be formed, selection oxide regions, tunnel oxide regions and matrix oxide regions on third areas of said substrate where selection transistors and memory transistors of EEPROM cells are to be formed;

defining floating gate regions on said tunnel oxide regions and said matrix oxide regions;

defining insulating regions on said floating gate regions;

defining LV gate regions on said LV gate oxide regions;

defining first source and drain regions laterally to said LV gate regions;

defining semiconductor material regions completely covering said second and third areas;

defining, at the same time, HV gate regions of said HV oxide regions, selection gate regions on said selection oxide regions and control gate regions on said insulating regions by a step of shaping said semiconductor material regions; and defining silicide regions on said LV source and drain regions and on said first gate regions.

2. The process of claim 1 wherein said defining silicide regions comprises:

covering said second and third areas with a protection mask of material different from silicon; and causing said source, drain and LV gate regions to react with a salicidation material to obtain said silicide regions.

3. The process of claim 1 wherein after said defining at the same time and before said defining silicide regions, the following are carried out:

defining second source and drain regions in said second areas, laterally to said HV gate regions;

defining third source and drain regions in said third areas, laterally to said floating gate and selection regions.

4. The process of claim 3 wherein said defining second source and drain regions and defining third source and drain regions are carried out at the same time.

5. The process of claim 1 wherein said defining LV gate regions and defining semiconductor material regions comprise depositing an upper layer of multi-crystal silicon and selectively removing said upper layer on said first areas to define at the same time said LV gate regions and said semiconductor material regions.

6. The process of claim 1 wherein said defining LV oxide regions comprises:

defining a matrix oxide layer extending on said first, second and third areas;

selectively removing said matrix oxide layer from said second areas and from predetermined portions of said third areas to define said matrix oxide regions on said third areas and temporary regions on said first areas;

defining a tunnel oxide layer extending above said matrix oxide regions and said substrate, at said third areas, above said temporary regions at said first areas and above said substrate at said second areas;

removing said tunnel oxide layer on said first and second areas and selectively on said third areas to define said tunnel oxide regions laterally to said matrix oxide regions;

defining a high voltage oxide layer extending on said matrix oxide regions, said tunnel oxide regions and said substrate at said third areas, above said temporary regions at said first areas and above said substrate at said second areas;

removing said high voltage oxide layer from said first areas; and forming a low voltage oxide layer on said first areas.

7. The process of claim 6, further comprising, after defining a tunnel oxide layer:

depositing a lower layer of multi-crystal silicon;

depositing an interpoly layer of dielectric material on said lower layer;

and, wherein removing said tunnel oxide layer is carried out at the same time as forming said floating gate regions and said insulating regions and comprises selectively etching said interpoly layer, said lower layer, and said tunnel oxide layer to form, on said third areas, stacks formed by said tunnel oxide regions, said matrix oxide regions, said floating gate regions, and said insulating regions.

8. The process of claim 1 wherein the defining LV oxide regions comprises:

defining a matrix oxide layer extending on the first, second, and third areas;

selectively removing the oxide layer from the second areas and from predetermined portions of the third areas to define the matrix oxide regions on the third areas and temporary regions on the first areas;

defining a tunnel oxide layer extending above the matrix oxide regions and the substrate at the third areas, above the temporary regions at the first areas, and above the substrate at the second areas, and depositing a first multi-crystal silicon layer, and defining an interpolydielectric layer;

removing the tunnel oxide layer on the first and second areas and selectively on the third areas by etching without reaching the temporary regions to define the tunnel oxide regions laterally to the matrix oxide regions;

defining a high voltage oxide layer extending on the matrix oxide regions, the tunnel oxide regions, and the substrate at the third areas, above the temporary regions at the first areas, and above the substrate at the second areas;

removing the high voltage oxide layer from the first areas; and forming a low voltage oxide layer on the first areas.

9. A process for manufacturing electronic devices having LV transistors, HV transistors and memory cells, comprising:

defining LV oxide regions on first areas of a substrate of silicon where low voltage transistors are to be formed, HV oxide regions on second areas of said substrate where high voltage transistors are to be formed, selection oxide regions, tunnel oxide regions and matrix oxide regions on third areas of said substrate where selection transistors and memory transistors of EEPROM cells are to be formed;

defining floating gate regions on said tunnel oxide regions and said matrix oxide regions;

defining insulating regions on said floating gate regions;

defining LV gate regions on said LV gate oxide regions;

defining first source and drain regions laterally to said LV gate regions;

defining semiconductor material regions completely covering said second and third areas;

defining, at the same time, HV gate regions of said HV oxide regions, selection gate regions on said selection oxide regions and control gate regions on said insulating regions by a step of shaping said semiconductor material regions;

defining, at the same time, second source and drain regions in the second areas laterally to the HV gate regions, and third source and drain regions in the third areas laterally to the floating gate and selection regions; and defining silicide regions on said LV source and drain regions and on said first gate regions.

10. A process for manufacturing electronic devices having LV transistors, HV transistors and memory cells, comprising:

forming LV oxide regions on first areas of a substrate of silicon where low voltage transistors are to be formed, HV oxide regions on second areas of said substrate where high voltage transistors are to be formed, selection oxide regions, tunnel oxide regions and matrix oxide regions on third areas of said substrate where selection transistors and memory transistors of EEPROM cells are to be formed, said forming LV oxide regions comprising:
  forming a matrix oxide layer extending on said first, second and third areas;
  selectively removing said matrix oxide layer from said second areas and from predetermined portions of said third areas to form said matrix oxide regions on said third areas and temporary regions on said first areas;
  forming a tunnel oxide layer extending above said matrix oxide regions and said substrate, at said third areas, above said temporary regions at said first areas and above said substrate at said second areas;
  removing said tunnel oxide layer on said first and second areas and selectively on said third areas to form said tunnel oxide regions laterally to said matrix oxide regions;
  forming a high voltage oxide layer extending on said matrix oxide regions, said tunnel oxide regions and said substrate at said third areas, above said temporary regions at said first areas and above said substrate at said second areas;
  removing said high voltage oxide layer from said first areas; and
  forming a low voltage oxide layer on said first areas;
forming floating gate regions on said tunnel oxide regions and said matrix oxide regions;
forming insulating regions on said floating gate regions;
forming LV gate regions on said LV gate oxide regions;
forming first source and drain regions laterally to said LV gate regions;
forming silicide regions on said LV source and drain regions and on said first gate regions;
forming semiconductor material regions completely covering said second and third areas; and
forming, at the same time, HV gate regions of said HV oxide regions, selection gate regions on said selection oxide regions and control gate regions on said insulating regions by a step of shaping said semiconductor material regions.

11. A process for manufacturing electronic devices having LV transistors, HV transistors and memory cells, comprising:
  forming LV oxide regions on first areas of a substrate of silicon where low voltage transistors are to be formed, HV oxide regions on second areas of said substrate where high voltage transistors are to be formed, selection oxide regions, tunnel oxide regions and matrix oxide regions on third areas of said substrate where selection transistors and memory transistors of EEPROM cells are to be formed, said forming LV oxide regions comprising:
    forming a matrix oxide layer extending on said first, second and third areas;
    selectively removing said matrix oxide layer from said second areas and from predetermined portions of said third areas to form said matrix oxide regions on said third areas and temporary regions on said first areas;
    forming a tunnel oxide layer extending above said matrix oxide regions and said substrate, at said third areas, above said temporary regions at said first areas and above said substrate at said second areas;
    depositing a lower layer of multi-crystal silicon;
    depositing an interpoly layer of dielectric material on said lower layer; and
    wherein removing said tunnel oxide layer is carried out at the same time as forming said floating gate regions and said insulating regions and comprises selectively etching said interpoly layer, said lower layer, and said tunnel oxide layer to form, on said third areas, stacks formed by said tunnel oxide regions, said matrix oxide regions, said floating gate regions, and said insulating regions;
    removing said tunnel oxide layer on said first and second areas and selectively on said third areas to form said tunnel oxide regions laterally to said matrix oxide regions;
    forming a high voltage oxide layer extending on said matrix oxide regions, said tunnel oxide regions and said substrate at said third areas, above said temporary regions at said first areas and above said substrate at said second areas;
    removing said high voltage oxide layer from said first areas; and
    forming a low voltage oxide layer on said first areas;
  forming floating gate regions on said tunnel oxide regions and said matrix oxide regions;
  forming insulating regions on said floating gate regions;
  forming LV gate regions on said LV gate oxide regions;
  forming first source and drain regions laterally to said LV gate regions;
  forming silicide regions on said LV source and drain regions and on said first gate regions;
  forming semiconductor material regions completely covering said second and third areas; and
  forming, at the same time, HV gate regions of said HV oxide regions, selection gate regions on said selection oxide regions and control gate regions on said insulating regions by a step of shaping said semiconductor material regions.

* * * * *